United States Patent [19]

Cain et al.

[11] Patent Number: 5,286,518
[45] Date of Patent: Feb. 15, 1994

[54] INTEGRATED-CIRCUIT PROCESSING WITH PROGRESSIVE INTERMETAL-DIELECTRIC DEPOSITION

[75] Inventors: John Cain, Schertz; Felix Fujishiro, San Antonio; Chang-Ou Lee, San Antonio; Sigmund Koenigseder, San Antonio; Landon Vines, San Antonio, all of Tex.

[73] Assignee: VLSI Technology, Inc., San Jose, Calif.

[21] Appl. No.: 876,276

[22] Filed: Apr. 30, 1992

[51] Int. Cl.$^5$ ............................................. C23C 16/00
[52] U.S. Cl. .................................. 427/96; 427/97; 427/99; 427/574; 427/579
[58] Field of Search ............... 427/96, 97, 99, 574, 427/579

[56] References Cited

U.S. PATENT DOCUMENTS

| | | | |
|---|---|---|---|
| 4,587,171 | 5/1986 | Hamano | 427/579 |
| 4,690,746 | 9/1987 | McInerney | 427/579 |
| 4,762,728 | 8/1988 | Keyser | 427/579 |
| 5,069,749 | 12/1991 | Gutierrez | 427/99 |

Primary Examiner—Terry J. Owens
Assistant Examiner—Vi Duong Dang
Attorney, Agent, or Firm—Clifton L. Anderson

[57] ABSTRACT

A semiconductor processing method provides for plasma-enhanced chemical-vapor deposition (PECVD) for intermetal dielectrics while minimizing risk of gate oxide impairment due to plasma discharge. A protective oxide sublayer is deposited without using high-power PECVD. The protective sublayer can be deposited by using chemical-vapor deposition (CVD) without plasma enhancement or by a lower-power PECVD. In the latter case, the initial rf power of the plasma is selected to be low enough to ensure that the gate oxide is not breached in the event of a plasma discharge. The protective sublayer can be thick enough to maintain its integrity in the event of a plasma discharge even during a higher-power PECVD deposition.

10 Claims, 2 Drawing Sheets

INTEGRATED-CIRCUIT PROCESSING WITH PROGRESSIVE INTERMETAL-DIELECTRIC DEPOSITION

BACKGROUND OF THE INVENTION

The present invention relates to integrated-circuit processing and, more particlarly, to an improved method for fabricating an integrated circuit with multiple metalization layers. A major objective of the present invention is multi-metalization integrated circuit manufacture with higher yields and more reliable resulting products.

Much of recent technological progress is associated with the increasing integrated circuit miniaturization made possible by the smaller feature sizes achieved by advances in semiconductor processing. Once the basic circuit elements, e.g., transistors, are fabricated, they must be interconnected to provide integrated functionality. Interconnections are typically made in photolithographically patterned metalization layers. As features become smaller, circuit density increases. To take advantage of the increased density, more complex routing is required to maximize functionality.

The demands for more complex routing are accommodated by using multiple metalization layers, typically patterned from deposited aluminum. These layers are electrically insulated from each other by "intermetal" dielectric layers, usually of silicon dioxide of "oxide". Apertures are patterned in an oxide layer to accommodate electrical connections ("vias") between the metalization layers. When a metal is deposited over the via apertures, the via apertures are filled with the interconnecting metal.

Once a metalization layer is deposited, subsequent processing must be designed to avoid melting the metal. Otherwise, the metal can melt and flow, impairing the metal pattern's precision. Metal flow can result in shorts or unacceptably high cross talk in operation, and any number of other unintended results. In particular, the presence of aluminum practically limits subsequent processing temperatures to about 450° C. or less.

This constraint applies to the intermetal dielectric. Accordingly, a relatively low-temperature chemical-vapor deposition (CVD) technique is available to deposit oxide on aluminum. One problem with unenhanced CVD is that it is slow. The slowness diminishes manufacturing throughput, which, in turn, increases manufacturing costs.

The presence of plasma increases the CVD rate. Accordingly, plasma-enhanced chemical-vapor deposition (PECVD) is used to attain higher manufacturing throughput while meeting thermal constraints on processing. Unfortunately, there is some evidence that PECVD can induce functional defects in some devices, adversely affect manufacturing yield. In addition, some apparently functional devices fail after repeated use. What is needed is an integrated circuit manufacturing method that provides the advantages of PECVD while providing greater yields and devices of greater reliability.

SUMMARY OF THE INVENTION

The present invention provides for a progressive intermetal dielectric deposition in which radio frequency (rf) power near the end of the deposition is higher than any rf power applied at the beginning of the deposition. The progression can take the form of two or more discrete steps or a rf power ramp. In either case, a higher rf power is begun before half of the ultimate deposition thickness is achieved.

Thus, fabrication of an integrated circuit involves: steps up through patterning of a first metal layer; intermetal dielectric deposition at no or low rf power; before half of the desired thickness is achieved, intermetal dielectric deposition at high rf power; via aperture formation; and deposition and patterning of the second metal layer.

The limitation imposed is that high-rf-power PECVD is only applied after the first metalization is insulated by a "protective" oxide. Prior to that time, a CVD process unenhanced by plasma can be used to deposit the protective oxide. In this case, the progressive intermetal dielectic deposition proceeds from zero or neglegible rf power to high power. Alternatively, a low power PECVD process can be used to deposit the protective oxide. In this case, the progression can be from low-rf-power PECVD to high-rf-power PECVD. As indicated above, this progression can be stepwise or gradual.

In every case, there is a transition from a lower or zero rf power to a higher power. Where the deposition procedure is stepped, a transition is easily identified. Where the transition is gradual from low-rf-power PECVD to high-rf-power PECVD, the transition can be assigned arbitrarily to a value attained before half of the desired dielectric thickness is attained.

What constitutes high and low rf power in absolute terms can vary by system and conditions. In one system, 300 watts rf power served as the high level, while 100 watts rf power served as the low power. Transition levels of 200 or 150 could be used to distinguish these highs and lows. The oxide thickness at which the transition occurs is less than half the eventual thickness to take optimal advantage of the faster depositions achievable using high-rf-power PECVD. For example, the first step can provide 500 Å to 1000 Å oxide, while the high-rf-power PECVD can continue until a total intermetal dielectric thickness of 2500 Å to 5500 Å is achieved, depending in part on whether the intermetal dielectric is to be etched back or not prior to deposition of the second metal layer.

In the course of the present invention, it was determined that yield and reliability problems were often related to breakdown of a gate oxide. This was surprising since the gate oxide was not exposed to the plasma. It was hypothesized that this breakdown was due to a plasma-generated current strong enough to overcome the gate oxide. It appeared that electrons were traveling from a remote rf electrode, through the plasma, to the first metalization layer, through vias to a gate, and through a gate oxide, and into a device channel. As the current flowed through, the integrity of the gate oxide was impaired.

The present invention addresses this gate oxide breakdown by depositing a thin oxide over the first metalization under conditions that preclude the development of a plasma-generated current sufficient to overcome the gate oxide. CVD variants such as low-pressure chemical-vapor deposition (LPCVD) and rapid-thermalization chemical-vapor deposition (RPCVD) do not rely on rf power, and thus avoid generating a gate-oxide threatening current. Alternatively, PECVD can be begun at a power too low to threaten the gate oxide. Once the metalization is protected by oxide thicker than the gate oxide, the rf power can be increased to enhance the deposition rate and manufacturing throughput.

In its simplest form, the present invention provides for a low power step followed by a high power step. The low-rf-power step has the advantage of protecting the gate oxide, but has the disadvantage of slow depositions. Once the gate oxide is in place, the high-rf-power step takes advantage of the faster deposition rate for most of the intermetal-dielectric oxide thickness. Note that all steps in this method of compatible with prior art processing steps so that no undue costs or inconveniences are incurred. Higher yields and reliability are achieved with nearly the throughput rate of PECVD. These and other features and advantages of the present invention are apparent in the following description with references to the drawings below.

DESCRIPTION OF THE PREFERRED EMBODIMENTS

Figure 1:
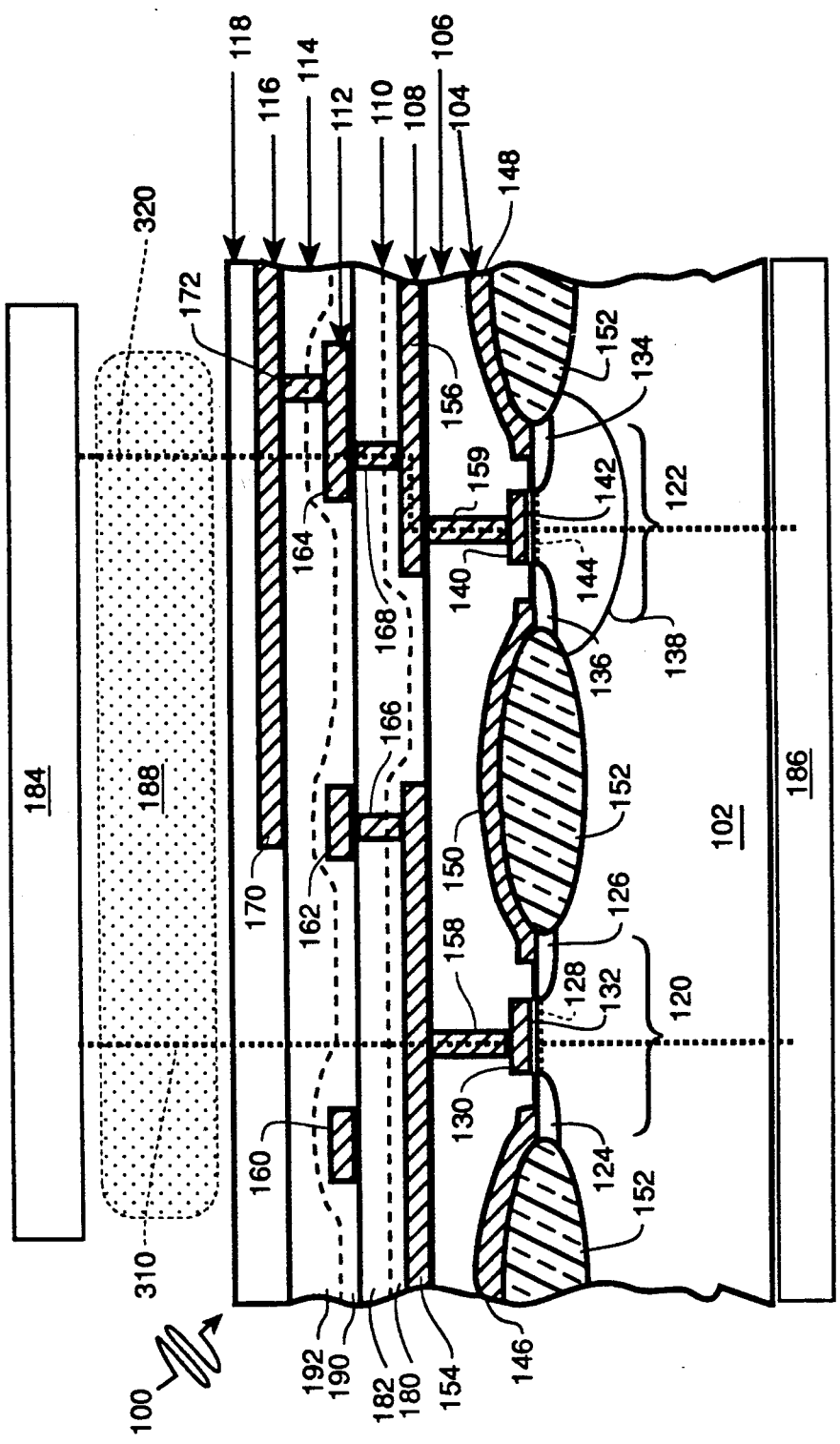
FIG. 1 is a schematic elevational view of a part of a MOS integrated circuit fabricated in accordance with the method of the present invention.
Figure 2:
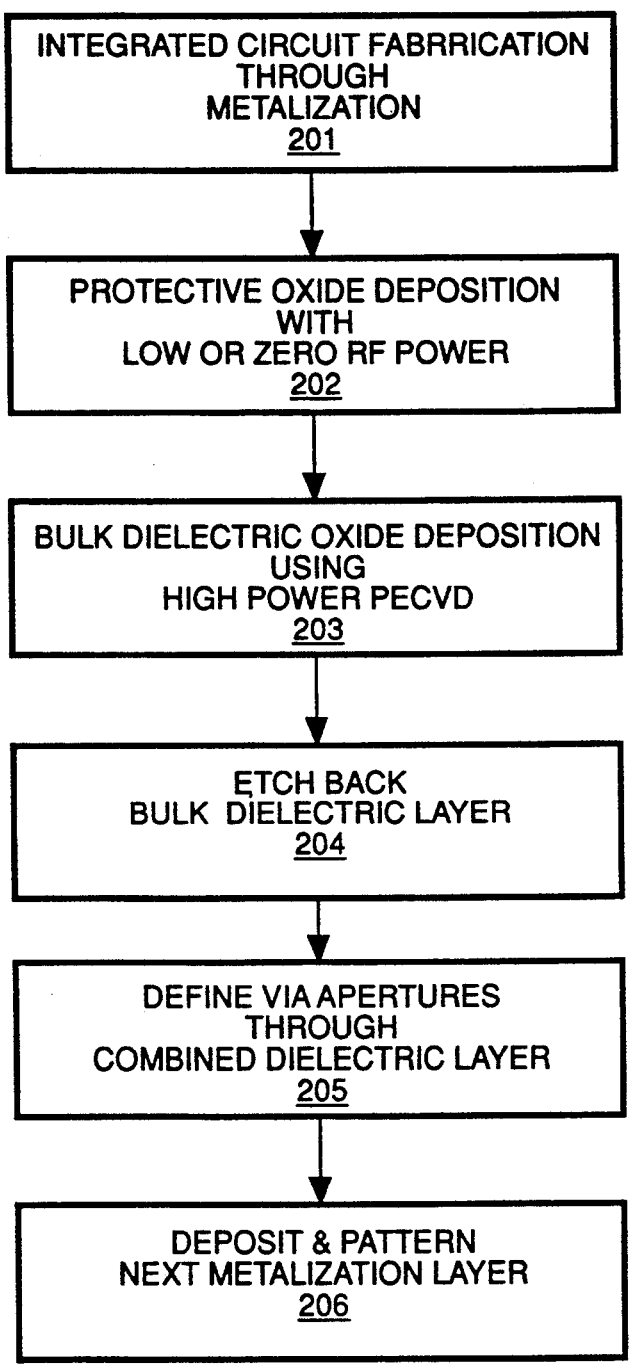
FIG. 2 is a flow chart of a method used to fabricate the integrated circuit of FIG. 1.

A "complementary metal-oxide-silicon" (CMOS) integrated circuit 100 fabricated in accordance with the present invention comprises an ascending series of layers including a substrate 102, a polysilicon layer 104, an organic glass layer 106, a first metalization layer 108, a first intermetal dielectric layer 110, a second metalization layer 112, a second intermetal dielectric layer 114, a third metalization layer 116, and a passivation layer 118, as shown in FIG. 1. Fabricated on a substrate 102 are an NMOS transistor 120 and a PMOS transistor 122.

NMOS transistor 120 is fabricated conventionally in substrate 102 that is of p-type silicon. P-type silicon favors the flow of positive charges (electron holes) over the flow of negative charges (electrons). An NMOS transistor selective permits a throughgoing current of negative charges. NMOS transistor 120 includes an n-type source 124 and an n-type drain 126 separated by a channel region 128 of substrate. A gate 130 is disposed over channel 128 and electrically insulated therefrom by a thin "gate oxide" 132 of silicon dioxide. In the absence of a voltage applied to gate 130, source 124 and drain 126 are separated by semiconductor material of the opposite conductivity type, so no current flows between source 124 and drain 126. A positive voltage applied to gate 130 draws electrons into a thin layer of channel-128 beneath gate oxide 132. The thin layer of electrons defines a connection between source 124 and drain 126, permitting current to flow therebetween. When the positive gate voltage is removed, the connection is broken.

PMOS transistor 122 has a p-type source 134 and a p-type drain 136 disposed within an n-well 138 formed in substrate 102. A gate 140 is defined in polysilicon layer 104 and is isolated from n-well 138 by a gate oxide 142. PMOS transistor 122 conducts in the absence of a positive gate potential. When a positive voltage is applied to gate 140, a channel 144 of n-well 138 below gate oxide 142 is depleted of positive carriers and conduction is prevented. Historically, MOS transistors had metal gates. More recently, the predominant practice employs polysilicon gates. Thus, "MOS=metal oxide silicon" is an accepted misnomer. Thus, in integrated circuit 100, the layer in which gates are defined is not a metalization layer. Instead, polysilicon layer 104 consists of polycrystalline silicon doped to enhance its conductivity.

In addition to gates 130 and 140, polysilicon layer 104 includes a source contact 146 for NMOS source 124, a source contact 148 for PMOS source 134, and a local interconnect 150 between NMOS drain 126 and PMOS drain 136. Each contact 146, 148 and interconnect 150 contacts at least one source or drain and extends in part over a field oxide 152. Field oxide 152 serves primarily to isolate transistors 120 and 122 from each other and from other devices of integrated circuit 100.

Interconnections among devices of integrated circuit 100 are provided by the three metalization layers 108, 112, and 116. First metalization layer 108 includes two aluminum conductors 154 and 156. Where desired, electrical isolation between first metalization layer 108 and polysilicon layer 104 is provided by organic glass layer 106. The organic glass provides a flat upper surface that serves as a base on which to form subsequent metalization layers 108, 112 and 116. Conductor 154 is electrically connected to NMOS gate 130 by a via 158 through organic glass layer 106, while conductor 156 is electrically coupled to PMOS gate 140 by another via 159 through organic glass layer 106.

Second metalization layer 112 includes conductors 160, 162 and 164. Electrical isolation is provided according to design by first intermetal dielectric layer 110. Conductor 160 is not connected to either of the illustrated first metalization layer conductors. Conductor 162 is electrically coupled to conductor 154 by a first intermetal via 166, while conductor 164 is coupled to conductor 156 by another first intermetal via 168.

Third metalization layer 116 includes illustrated conductor 170. Third metalization layer 116 is electrically isolated according to design from second metalization layer 112 by second intermetal dielectric layer 114. Conductor 170 is connected to conductor 164 by a second intermetal via 172. Third metalization layer 116 is also protected from corrosion by passivation layer 118.

Integrated circuit 100 is fabricated by a method 200 in accordance with the present invention. Fabrication at step 201 through the patterning of first metalization layer 108 is conventional. Then a protective sublayer 180 is deposited at step 202 to a thickness of 1000 Å using low pressure chemical-vapor deposition (LPCVD) without any plasma enhancement. A brief thermal pulse can be applied to facilitate deposition in accordance with a rapid thermal low-pressure chemical-vapor deposition technique (RTLPCVD). The thermal pulse generates temperatures of 600° C.–700° C. However, the pulse is so brief that the aluminum of first metalization layer 108 cannot flow.

With protective sublayer 180 in place, a bulk dielectric oxide sublayer 182 is deposited at step 203 using a high-power PECVD process. In this process a radio frequency alternating voltage is applied between a remote electrode 184 and a base electrode 186, on which integrated circuit 100 is supported. The radio frequency field so established ionizes molecules of ambient gases, establishing a plasma 188. Reactant gases are flowed over first metalization layer under conditions causing an oxide to be deposited thereon. The deposition rate is increased by the presence of plasma 188. Spent reactant gases are evacuated by the processing system. The rf power applied to generate plasma 188 is dependent on system design.

In the system used to fabricate integrated circuit 100, 300 watts rf power were applied to optimize deposition rates. This process is continued until bulk dielectric oxide sublayer 182 is 4500 Å thick. Bulk dielectric sublayer 182 is etched back 3000 Å, leaving a thickness of 1500 Å. This yields a total thickness of 2500 Å for the combined dielectric layer 110. The etch back procedure leaves a flat base for the second metalization. Apertures are defined through first intermetal dielectric layer 110 at step 205. Second metalization layer 112 is deposited at step 206. During deposition, vias 166 and 168 are formed as the first intermetal dielectric via apertures are filled. Second metalization layer 112 is then patterned to define conductors 160, 162 and 164.

The last five steps are reiterated with variations to provide for third metalization layer 116. In this case, a low-power PECVD process at about 100 watts is used to form a second protective oxide sublayer 190. Once the protective layer is 500 Å thick, wattage is stepped up to 300 watts to deposit a bulk dielectric sublayer for another 2500 Å, rendering a second intermetal dielectric thickness of about 3000 Å. Etch back is not used in this second iteration. Apertures are defined in the combined second intermetal dielectric layer 114. Third metalization layer 116 is deposited, forming via 172. Third metalization layer 116 is patterned defining conductor 170.

It had been found in prior runs that, under some circumstances, a plasma could contact remote electrode 184 and an exposed conductor. If that conductor were electrically connected to a gate, the voltage present could be great enough to disrupt the integrity of gate oxide.

For example, a high-power PECVD applied to an unprotected first metalization could generate a current indicated at 310, as shown in FIG. 1. This current would flow from remote electrode 184, through plasma 188, through first metalization conductor 154, through via 158, through NMOS gate 130, through gate oxide 132, and through substrate 102 to base electrode 186. (Layers above first metalization layer 108 are not in place, and therefore are not in the current path.)

Likewise, a high-power PECVD applied to an unprotected second metalization layer 112 could cause a current as indicated at 320, from remote electrode 184, through plasma 188, through conductor 164, through first intermetal via 168, through first metalization conductor 156, through via 159, through PMOS gate 140, through gate oxide 142, and through substrate 102 to base electrode 186. The protective sublayers 180 and 190 of the present invention ensure that when the high-power PECVD is applied, sufficient dielectric is in the potential path that dielectric integrity is maintained. Gate oxides 132 and 142 need not be relied on.

Differences in method 200 as applied to first and second intermetal dielectrics were introduced in part to illustrate variations in the present invention. In other embodiments, the different intermetal dielectrics are formed in the same way to simplify procedures. The protective layer can be performed with no rf power or with low rf power. Different protective layer thicknesses are provided for. Different rf powers can be selected for the protective and bulk depositions. Generally, the protective sublayer is thinner than the bulk dielectric layer, since the later is deposited at a higher rate, so throughput can be increased.

The rf power used to form the protective layer is as high as possible, to provide greater deposition rates, without threatening a breach of gate oxide integrity. In general, 100 watts rf power is safe. However, satisfactory results may be obtained at 150 watts or 200 watts. The rf power for the bulk dielectric layer is a function of the thickness of the protective oxide. Optimally, 300 watts can be used, but 200 or more can provide useful enhancement of deposition rates.

While the transition from low rf power to high rf power is described involving single steps, multiple steps and continuous ramps are provided for. After all, as soon as any oxide is deposited there is some protection, so rf power can be increased. In such a case, the dividing line between low and high rf power becomes somewhat arbitrary. However, the transition should occur before half of the thickness is applied to achieve optimal throughput. These and other modifications to and variations upon the described embodiments are provided for by the present invention, the scope of which is limited only by the following claims.

What is claimed is:

1. A method of fabricating a multi-metalization-layer integrated circuit, said method comprising the steps of:
fabricating an integrated circuit through patterning a first metalization layer;
depositing a protective oxide sublayer over said first metalization by chemical vapor deposition while restricting any plasma enhancement to the chemical vapor deposition to an rf power of at most 200 watts;
depositing a bulk dielectric oxide sublayer over said protective oxide sublayer by a plasma-enhanced chemical-vapor deposition in which the rf power is greater than 200 watts, said bulk dielectric oxide sublayer being thicker than said protective oxide sublayer, said protective oxide sublayer and said bulk dielectric oxide sublayer collectively constituting a dielectric layer;
defining via apertures through said dielectric layer; and
patterning a second metalization over said dielectric layer so as to define interconnects for said integrated circuit.

2. A method as recited in claim 1 wherein said protective oxide sublayer is deposited using plasma-enhanced chemical vapor deposition.

3. A method as recited in claim 2 wherein said protective oxide sublayer is deposited with an rf power below 150 watts.

4. A method as recited in claim 3 wherein said protective oxide sublayer is deposited with an rf power of no more than 100 watts.

5. A method as recited in claim 1 wherein said protective oxide sublayer is deposited using low-pressure chemical vapor deposition without said plasma enhancement.

6. A method as recited in claim 1 wherein said protective oxide sublayer is deposited using rapid-thermal low-pressure chemical vapor deposition without said plasma enhancement.

7. A method as recited in claim 1 wherein said protective oxide sublayer is between 500 Å and 1000 Å thick and wherein said bulk dielectric layer is at least 2500 Å thick.

8. A method as recited in claim 1 wherein said bulk dielectric layer is etched back before said second metalization is patterned.

9. A method as recited in claim 2 wherein the rf power applied during said protective oxide step is gradually increased to 200 watts and above thereby initiating said bulk dielectric step.

10. A method as recited in claim 1 wherein said bulk dielectric step uses a rf power of at least 300 watts.

* * * * *